United States Patent
Fujihara

(10) Patent No.: US 11,205,463 B2
(45) Date of Patent: Dec. 21, 2021

(54) ASYNCHRONOUS FIFO CIRCUIT

(71) Applicant: NEC Platforms, Ltd., Kawasaki (JP)

(72) Inventor: Koki Fujihara, Tokyo (JP)

(73) Assignee: NEC Platforms, Ltd., Kanagawa (JP)

( * ) Notice: Subject to any disclaimer, the term of this patent is extended or adjusted under 35 U.S.C. 154(b) by 0 days.

(21) Appl. No.: 16/755,311

(22) PCT Filed: Sep. 5, 2018

(86) PCT No.: PCT/JP2018/032935
§ 371 (c)(1),
(2) Date: Apr. 10, 2020

(87) PCT Pub. No.: WO2019/077900
PCT Pub. Date: Apr. 25, 2019

(65) Prior Publication Data
US 2021/0193202 A1     Jun. 24, 2021

(30) Foreign Application Priority Data
Oct. 19, 2017   (JP) .............................. JP2017-202859

(51) Int. Cl.
*G11C 7/22* (2006.01)
*G11C 7/10* (2006.01)

(52) U.S. Cl.
CPC ............ *G11C 7/222* (2013.01); *G11C 7/1057* (2013.01); *G11C 7/1063* (2013.01); *G11C 7/1084* (2013.01); *G11C 7/1096* (2013.01)

(58) Field of Classification Search
CPC ..... G11C 7/222; G11C 7/1096; G11C 7/1063; G11C 7/1084; G11C 7/1057
See application file for complete search history.

(56) References Cited

U.S. PATENT DOCUMENTS 6,078,980 A   6/2000  Holland et al.
6,400,785 B1  6/2002  Sunaga et al.
(Continued)

FOREIGN PATENT DOCUMENTS

EP   1317085 A2  6/2003
JP   3013800 B2  2/2000
(Continued)

OTHER PUBLICATIONS

H. Han and K. S. Stevens, "Clocked and asynchronous FIFO characterization and comparison," 2009 17th IFIP International Conference on Very Large Scale Integration (VLSI-SoC), Florianopolis, Brazil, 2009, pp. 101-108, doi: 10.1109/VLSISOC.2009.6041338. (Year: 2009).*

(Continued)

*Primary Examiner* — Ajay Ojha
(74) *Attorney, Agent, or Firm* — Sughrue Mion, PLLC

(57) ABSTRACT

An asynchronous FIFO circuit of the present invention generates a write clock and a read clock from the same input clock, and generates a write control signal in synchronization with the write clock and a read control signal in synchronization with the read clock. The asynchronous FIFO circuit includes a data read-write unit having a plurality of data holding units. The data read-write unit writes data into one of the data holding units for each write clock on the basis of the write control signal, and reads data from one of the data holding units for each read clock on the basis of the read control signal.

8 Claims, 6 Drawing Sheets

(56) References Cited

U.S. PATENT DOCUMENTS

| | | | |
|---|---|---|---|
| 9,330,740 B1* | 5/2016 | Baeckler | G11C 7/222 |
| 2013/0249719 A1* | 9/2013 | Ryan | H03M 1/06 |
| | | | 341/118 |
| 2014/0250260 A1* | 9/2014 | Yap | G11C 7/1057 |
| | | | 711/103 |
| 2015/0160920 A1* | 6/2015 | Bergkvist, Jr. | G06F 5/065 |
| | | | 710/310 |

FOREIGN PATENT DOCUMENTS

| JP | 2002-245773 A | 8/2002 |
|---|---|---|
| JP | 2002-533832 A | 10/2002 |
| JP | 2006-191389 A | 7/2006 |

OTHER PUBLICATIONS

International Search Report for PCT Application No. PCT/JP2018/032935, dated Nov. 6, 2018.
Japanese Office Action for JP Application No. 2017-202859 dated Oct. 30, 2018 with English Translation.
Japanese Office Action for JP Application No. 2017-202859 dated Mar. 12, 2019 with English Translation.
Extended European Search Report for EP Application No. EP18868911.1 dated Jun. 30, 2021.

* cited by examiner

ASYNCHRONOUS FIFO CIRCUIT

This application is a National Stage Entry of PCT/JP2018/032935 filed on Sep. 5, 2018, which claims priority from Japanese Patent Application 2017-202859 filed on Oct. 19, 2017, the contents of all of which are incorporated herein by reference, in their entirety.

TECHNICAL FIELD

The present invention relates to an asynchronous first-in first-out (FIFO) circuit, and in particular, to an asynchronous FIFO circuit not requiring a full/empty determination circuit.

BACKGROUND ART

In the case of processing consecutive data such as a memory access, a circuit that determines full/empty may be provided as described in Patent Literature 1.
Patent Literature 1: JP 3013800 B

SUMMARY

In an asynchronous FIFO circuit including the above-described circuit that determines full/empty, when it is full with data, a data queue is generated. Therefore, a buffer is required at an input part of a transfer circuit, causing the control circuit to be complicated. Moreover, when the data width is wide, there is a case where the transfer timing differs between bits due to physical constraint. This makes the control more complicated, and a time is needed time until the entire data is prepared.

In the transfer using asynchronous FIFO, data may be delivered from a write pointer to a read pointer in order to check that the read pointer does not take over the write pointer. This may cause a problem of an increase in the latency from writing to reading.

Therefore, an object of the present invention is to provide an asynchronous FIFO circuit capable of solving the above-described problems, that is, complicated control and an increase in the latency from writing to reading.

An asynchronous FIFO circuit that is an aspect of the present invention includes
a write clock generation unit that generates, from an input clock, a write clock to be used in write processing;
a read clock generation unit that generates, from the input clock, a read clock to be used in read processing;
a write control signal generation unit that generates a write control signal for controlling data write timing, in synchronization with the write clock;
a read control signal generation unit that generates a read control signal for controlling data read timing, in synchronization with the read clock; and
a data read-write unit having a plurality of data holding units.

The data read-write unit writes data into one of the data holding units for each write clock on the basis of the write control signal, and reads data from one of the data holding units for each read clock on the basis of the read control signal.

An asynchronous FIFO circuit that is an aspect of the present invention includes
a write domain phase locked loop (PLL) that generates, from an input clock, a write clock to be used in write processing;

a read domain PLL that generates, from the input clock, a read clock to be used in read processing;
a write control signal generation circuit that generates a write control signal for controlling data write timing, in synchronization with the write clock;
a read control signal generation circuit that generates a read control signal for controlling data read timing, in synchronization with the read clock; and
a FIFO including a plurality of buffers.

The FIFO writes data into one of the buffers for each write clock on the basis of the write control signal, and reads data from one of the buffers for each read clock on the basis of the read control signal.

Further, a data read-write method that is an aspect of the present invention includes,
by an asynchronous FIFO circuit including a plurality of data holding unites,
generating, from an input clock, a write clock to be used in write processing, and generating, from the input clock, a read clock to be used in read processing;
generating a write control signal for controlling data write timing, in synchronization with the write clock, and generating a read control signal for controlling data read timing, in synchronization with the read clock; and
writing data into one of the data holding units for each write clock on the basis of the write control signal, and reading data from one of the data holding units for each read clock on the basis of the read control signal.

Since the present invention is configured as described above, the present invention can provide an asynchronous FIFO circuit in which control is not complicated and the latency from writing to reading can be reduced.

EXEMPLARY EMBODIMENTS

First Exemplary Embodiment

Figure 1:
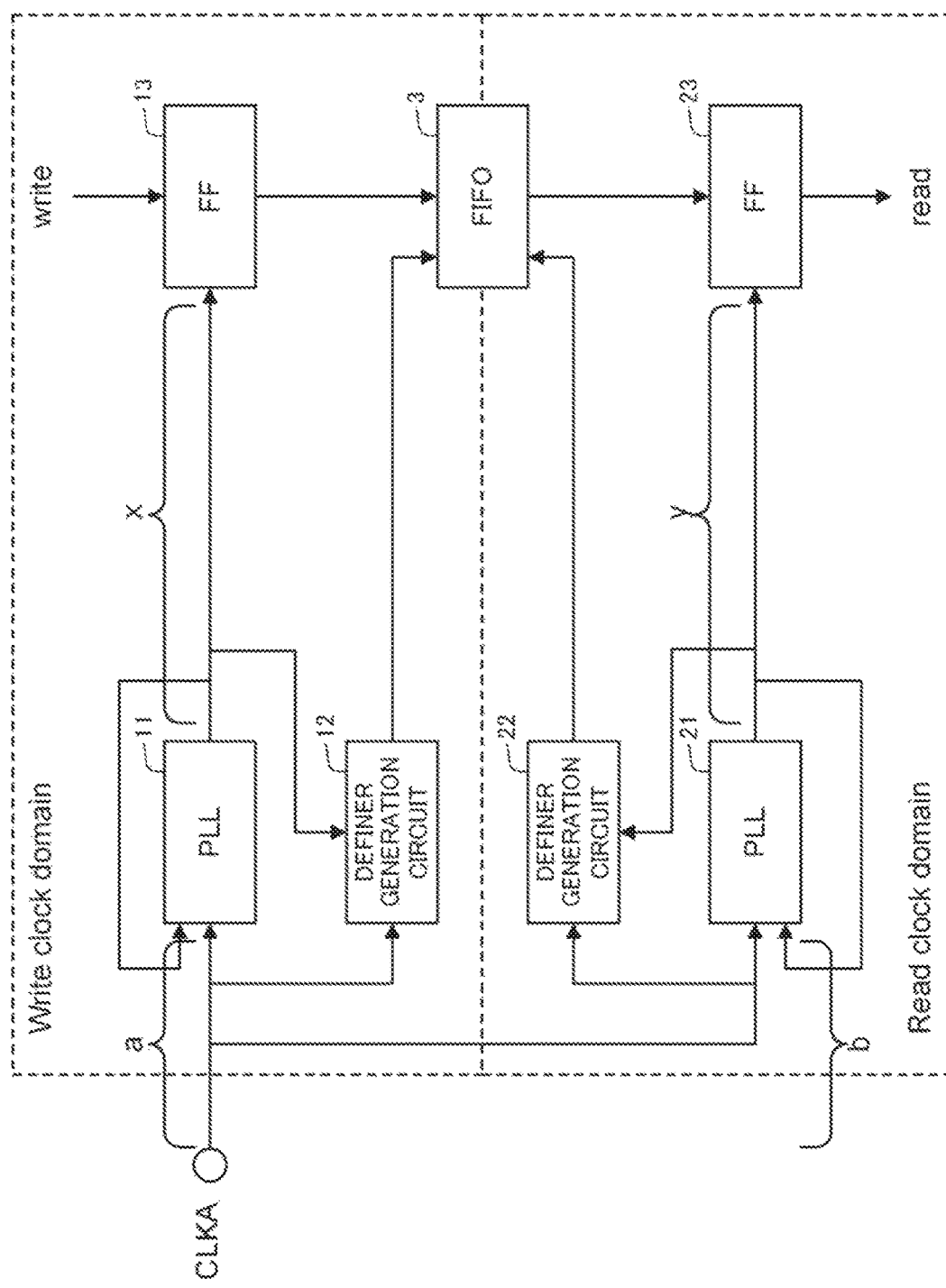
FIG. 1 is a block diagram illustrating a configuration of an asynchronous FIFO circuit according to a first exemplary embodiment of the present invention.
Figure 2:
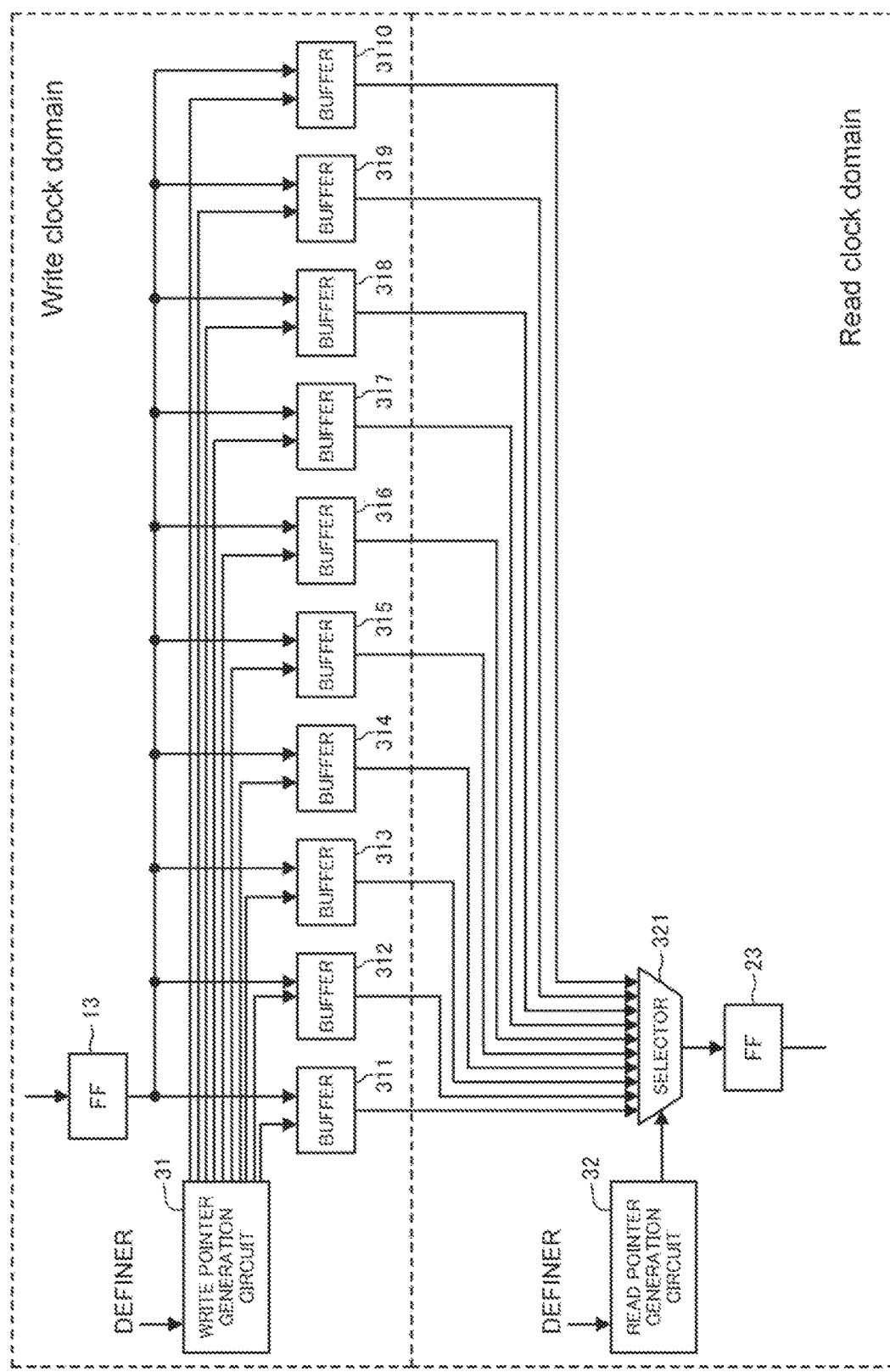
FIG. 2 is a block diagram illustrating a configuration of the FIFO disclosed in FIG. 1.
Figure 3:
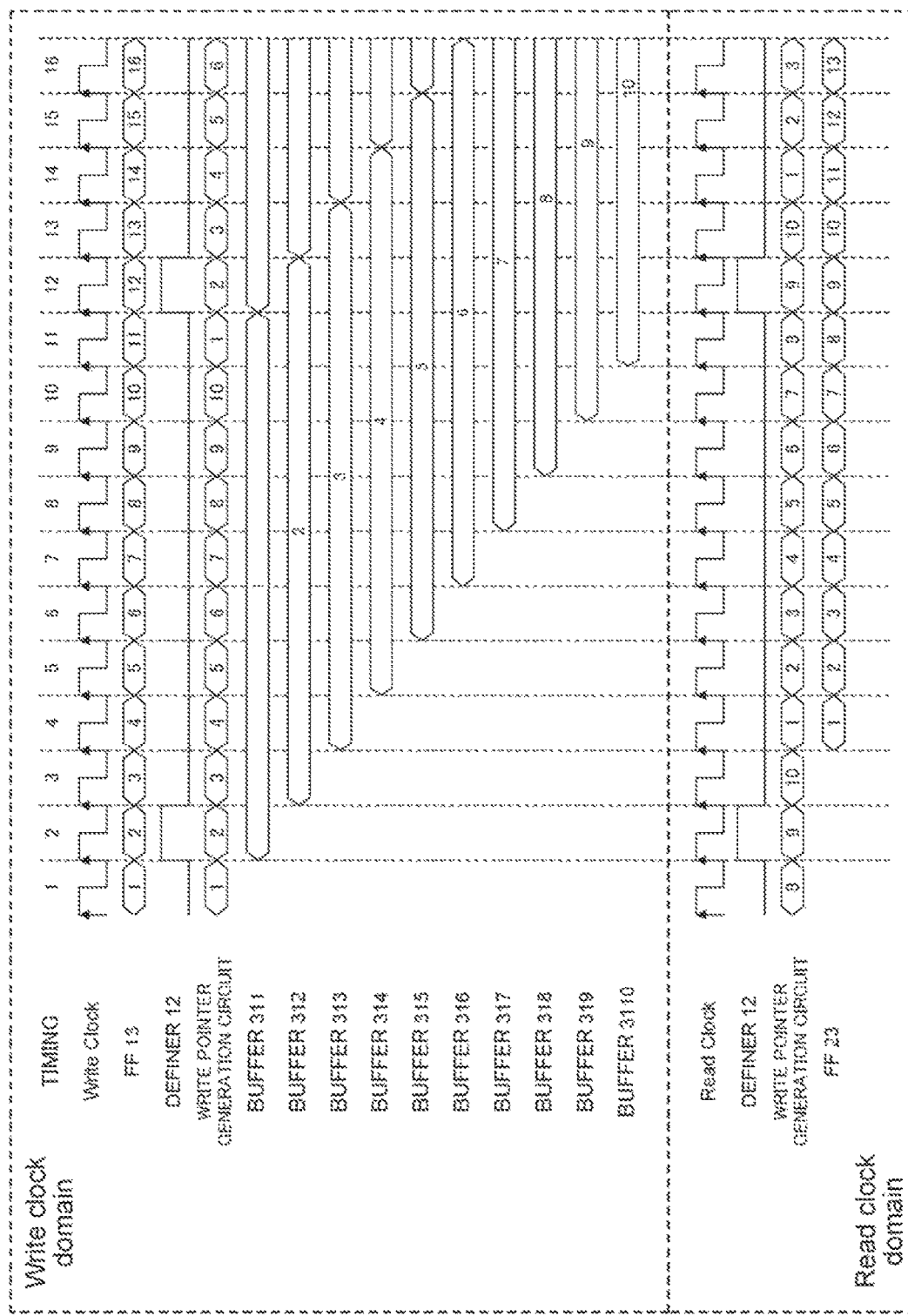
FIG. 3 is a time chart illustrating an operation of the asynchronous FIFO circuit disclosed in FIG. 1.
Figure 4:
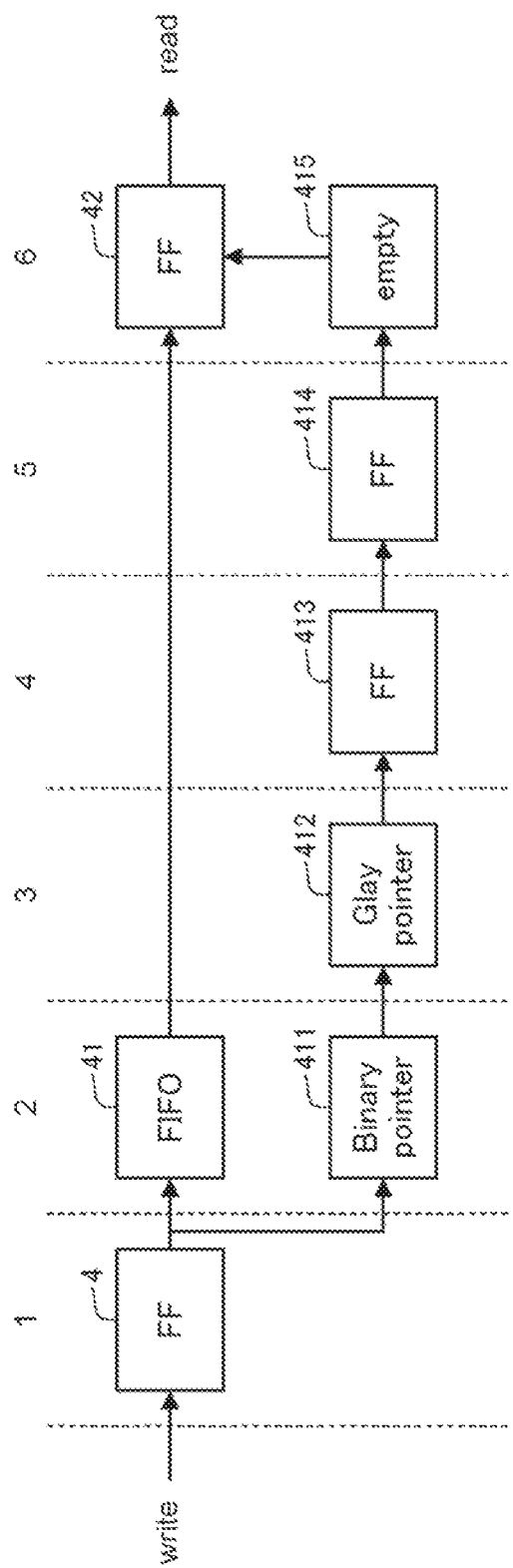
FIG. 4 illustrates a flow of data processing of an asynchronous FIFO circuit compared with the present invention.
Figure 5:
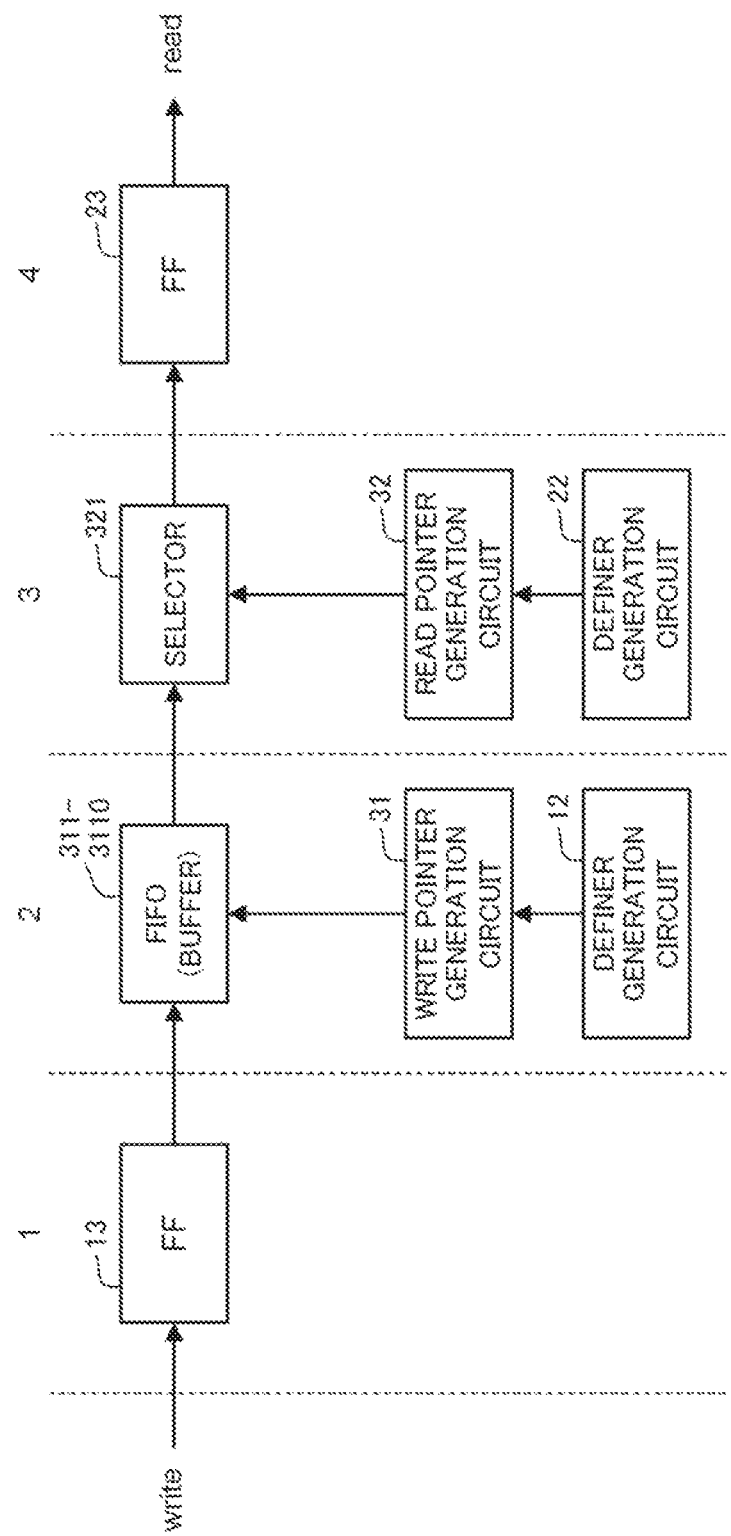
FIG. 5 illustrates a flow of data processing of an asynchronous FIFO circuit that is the present invention.

A first exemplary embodiment of the present invention will be described with reference to FIGS. 1 to 5. FIGS. 1 and 2 are diagrams for explaining a configuration of an asynchronous FIFO circuit. FIG. 3 is a diagram for explaining an operation of the asynchronous FIFO circuit. FIGS. 4 and 5 are diagrams for explaining effects of the present invention.
[Configuration]

As illustrated in FIG. 1, an asynchronous FIFO circuit of the present invention includes, in the write clock domain, a phase locked loop (PLL) 11, a definer generation circuit 12, and a flip-flop (FF) 13. The asynchronous FIFO circuit also includes, in the read clock domain, a PLL 21, a definer generation circuit 22, and a flip-flop (FF) 23. The asynchronous FIFO circuit also includes a FIFO (first-in, first-out) 3 for data transfer. The FIFO belongs to both the write clock domain and the read clock domain.

The PLL 11 (write clock generation unit) in the write clock domain generates a write clock to be used in write processing from an input clock CLKA by multiplying the clock CLKA by n. The PLL 21 (read clock generation unit) in the read clock domain generates a read clock to be used in read processing from a clock CLKA that is the same as the clock input to the PLL 11 in the write clock domain by multiplying the clock CLKA by m. In the present embodiment, it is assumed that the CLKA frequency is 100 MHz, a write clock is 1 GHz, a read clock is 1 GHz, and write clock=read clock.

In the present embodiment, in order to synchronize the write timing from the FF 13 to the FIFO 3 in the write domain and the read timing from the FIFO 3 to the FF 23 in the read domain, a distribution delay "a" from the CLKA, illustrated in FIG. 1, to the PLL 11 and a distribution delay "b" from the CLKA to the PLL 21 are designed to be the same, as described below.

Furthermore, in the present embodiment, a difference between the write timing from the FF 13 to the FIFO 3 and the read timing from the FIFO 3 to the FF23 is incorporated in a delay of a level not exceeding the cycle value of the PLL 11 and the PLL 21. In this case, since the delays to the respective PLLs 11 and 21 are assumed to be the same, by considering a delay difference |delay x−delay y| from each of the PLL 11 and 21 to each of the FF 13 and 23, the difference between the write timing to the FIFO 3 and the read timing from the FIFO 3 can be kept within the cycle of the PLL 11 and the PLL 21. Thereby, it is not necessary to expand the timing generation in the read processing, described below, up to a value exceeding the cycle value of the PLL 11 and the PLL 21. It is only necessary to set a read pointer that can ensure the delay difference |delay x−delay y|.

The definer generation circuit 12 (write control signal generation unit) in the write clock domain generates a write definer signal (write control signal) that is a pulse signal in synchronization with a write clock generated by the PLL 11. The write definer signal is used for controlling data write timing from the FF 13 by the FIFO 3, as described below.

Note that in the write clock from which the write definer signal is generated, the clock edge matches that of the CLKA. Therefore, the write definer signal in synchronization with the write clock becomes a pulse signal of a CLKA cycle. For example, in the present embodiment, it is set that the write clock is 1 GHz and the write definer signal is 100 MHz.

Similarly, the definer generation circuit 22 (read control signal generation unit) in the read clock domain generates a read definer signal (read control signal) that is a pulse signal in synchronization with a read clock generated by the PLL 21. The read definer signal is used for controlling data read timing from the FIFO 3 to the FF 23, as described below.

Note that in the read clock from which the read definer signal is generated, the clock edge matches that of the CLKA. Therefore, the read definer signal in synchronization with the read clock becomes a pulse signal of a CLKA cycle. For example, in the present embodiment, it is set that the read clock is 1 GHz and the read definer signal is 100 MHz.

As described above, in the present embodiment, the same clock CLKA is used for the clocks input to the different PLLs 11 and 21 in the write domain and the read domain. Further, a write definer signal and a read definer signal are generated in synchronization with the PLL 11 and the PLL 21, respectively. Therefore, the write processing and the read processing operate in a predetermined cycle, as described below.

As illustrated in FIG. 2, the FIFO 3 includes a write pointer generation circuit 31 in the write clock domain, and includes a read pointer generation circuit 32 and a selector 321 in the read clock domain. In the transfer part from write to read, a plurality of buffers (data holding units) are required. The number of buffers is determined by the write clock frequency and the frequency of the write definer signal. In the present embodiment, the write clock is 1 GHz and the write definer signal is 100 MHz. Therefore, the maximum number of buffers in which write data can be written in a definer cycle is ten, so that ten stages of buffers 311 to 3110 are included, as illustrated in FIG. 2. In the present embodiment, the read definer signal is assumed to be 100 MHz.

The write pointer generation circuit 31 activates a series of write processing when a write definer signal is input, and generates a write pointer specifying one of the buffer 311 to 3110 for writing data from the FF 13 to the FIFO 3. Then, after activating the series of write processing, the write pointer generation circuit 31 generates a value incremented by 1 for each write clock, that is, each cycle, and uses it as a write pointer. The write pointer generation circuit 31 also activates a series of write processing each time a write definer signal is input, and generates a write pointer of the same value each time the processing is activated. For example, in the present embodiment, when a write definer signal is input, a write pointer "2" is set. For each cycle of the write clock, a write pointer "3, 4, or 5, . . . " is generated. Then, when a write definer signal is input next time, the write pointer "2" is set again.

Then, for each cycle of the write clock, the FIFO 3 writes data from the FF13 to one of the buffers 311 to 3110 specified by the write pointer generated as described above.

The read pointer generation circuit 32 activates a series of read processing when a read definer signal is input, and generates a read pointer specifying one of the buffers 311 to 3110 for reading data from the FIFO 3 to the FF 23. Then, after activating the series of read processing, the read pointer generation circuit 31 generates a value incremented by 1 for each write clock, that is, each cycle, and uses it as a read pointer. The read pointer generation circuit 31 also activates a series of read processing each time a read definer signal is input, and generates a read pointer of the same value each time the processing is activated. For example, in the present embodiment, when a read definer signal is input, a read pointer "9" is set. For each cycle of the read clock, a read pointer "10, 11, or 12, . . . " is generated. Then, when a read definer signal is input next time, the read pointer "9" is set again.

Then, for each cycle of the read clock, the FIFO 3 selects one of the buffers 311 to 3110 specified by the read pointer generated as described above, and reads out data to the FF 23.

In the present embodiment, since the write definer signal and the read definer signal are in the same timing, the FIFO 3 activates the series of write processing and the series of read processing at the same timing in the write pointer generation circuit 31 and the read pointer generation circuit 32. Then, at the time of activation, the write pointer generation circuit 31 and the read pointer generation circuit 32 respectively generate a write pointer and a read pointer different from each other. For example, in the present embodiment, at the time of activation, a read pointer that is three cycles later with respect to the write pointer is generated. Thereby, the relationship between the read pointer and the write pointer is always secured. Since a read pointer that is three cycles later with respect to the write pointer is generated constantly, the read processing will never overtake the write processing.

[Operation]

Next, an operation of the asynchronous FIFO circuit, from writing data into the FIFO 3 to reading data, will be described with reference to the time chart of FIG. 3.

First, delays from the CLKA to the PLL 11 and to the PLL 21 are the same delay. Therefore, when a write definer signal indicating the write timing is set to timing 2, a read definer signal indicating the read timing is also set to timing 2. That is, a series of write processing and a series of read processing are activated at the same timing.

In the above-described state, first, write processing will be described. With a write definer signal used as activation timing, the write pointer generation circuit 31 generates a value that is incremented for each cycle of the write clock, and uses it as a write pointer. At that time, the same pointer value is generated at each activation timing of a write definer signal ("2" in the present embodiment).

Then, when data exists in the FF 13, the FIFO 3 writes the data of the FF 13 in the buffer indicated by the write pointer value, while when data does not exists, the FIFO 3 writes an indefinite in the buffer indicated by the write pointer value. As illustrated in FIG. 3, at timing 1, data "1" exists in the FF 13, and the pointer value of the write pointer generation circuit is 1. Therefore, a data set instruction is issued to the buffer at timing 1, and the data is held in the buffer 311 at timing 2. Note that the time when the next data is set to the buffer 311 is timing 12 that is subsequent to timing 11 at which an instruction was made when the write pointer takes 1.

Similarly, for the data "2" in the FF 13 at timing 2, a data set instruction is made at timing 2. Therefore, the data is held in the buffer 312 at timing 3. The write processing is executed according to the pointer value of the write pointer generation circuit if data exists in the FF 13.

Next, read processing will be described. With a read definer signal used as activation timing, the read pointer generation circuit 32 generates a value that is incremented by 1 for each cycle, and uses it as a read pointer. At that time, the same pointer value is generated at each activation timing of a read definer signal. In the present example, since reading is performed after three cycles of the write timing, a read pointer "9" is set at each activation. That is, the pointer value of a write pointer appears as a pointer value of a read pointer after three cycles. When data exists in any of the buffers 311 to 3110, the data in such a buffer 311 to 3110 is read according to the pointer value of the read pointer, while when no data exists, an indefinite is read according to the pointer value of the read pointer.

In the transfer circuit of the present invention, both the write processing and the read processing are processed in accordance with the pointer value. Therefore, by matching the pointer values of the write processing and the read processing at a timing, it is possible to secure the relationship between the read pointer and the write pointer constantly, whereby a read pointer after a certain cycle with respect to a write pointer is constantly generated. Therefore, the read processing will never take over the write processing, so that transfer can be performed without comparing the pointers.

Here, a comparison between the asynchronous FIFO circuit of the present invention and an asynchronous FIFO circuit different from that of the present invention will be described with reference to FIGS. 4 and 5.

In the asynchronous FIFO circuit illustrated in FIG. 4 that is different from that of the present invention, in a flow of data processing from a write FF 4 to a read FF 42, first, data is written from the write FF 4 to a FIFO 41 at timing 2. At the same time, a pointer value of the FIFO is stored as a binary pointer 411, and at timing 3, the binary pointer value is converted into a Gray code and is stored as a Gray pointer 412. Then, in order to stabilize the data, it is stored in an FF 413 at timing 4 and in an FF 414 at timing 5 as a synchronous FF. Since the number of FF stages conforms to the circuit rule, the present example has two stages. After transfer to the read domain CLK, it is determined whether or not the FIFO is empty by an empty determination circuit 415, and when it is determined that the FIFO is not empty, reading is performed. As described above, the asynchronous FIFO circuit different from that of the present invention needs six cycles.

Meanwhile, in the present invention, since empty determination is not performed by pointer comparison, conversion to a Gray code and stabilization in the FFs are not required. Therefore, circuits denoted by the reference numerals 412 to 415 in FIG. 4 are unnecessary. Consequently, in the present invention, read processing can be performed at timing 4, so that an increase in the processing speed by two cycles can be realized. Therefore, latency can be shortened.

Moreover, the processing of the present invention is configured to perform writing and reading regardless of presence or absence of a request. Accordingly, data control can be simplified. Therefore, it is appropriate for processing streaming data in which consecutive data is processed.

As described above, the present invention has a circuit configuration of using the same CLK (CLKA) for different PLL inputs, in data transfer between different PLL domains. Then, in the case where a write clock to be used in the write processing is a clock obtained by multiplying the CLKA by n, the clock edge of the write clock matches that of the CLKA. Therefore, the present invention has a circuit configuration of using a circuit (definer generation circuit) that generates a pulse signal of the CLKA cycle in synchronization with the write clock. Then, in the case where a read clock to be used in the read processing is a clock obtained by multiplying the CLKA by m, the clock edge of the read clock matches that of the CLKA. Therefore, the present invention has a circuit configuration of using a read definer circuit that generates a pulse signal of the CLKA cycle in synchronization with the read clock.

With the three circuits mounted and by using the definer circuit in the write domain and the definer circuit in the read domain, it is found that n units of write data and m units of read data exist in the CLKA cycle. Therefore, by adjusting that m units of read data do not read n units or more write data at the time of design, fixed-time transfer can be made rather than transfer by delivering a write pointer to a read pointer, so that a circuit that can shorten the latency can be realized.

Note that the embodiment described above shows an exemplary configuration that is applicable under the conditions of CLKA frequency=100 MHz, write clock=1 GHz, read clock=1 GHz, and write clock=read clock. However, the asynchronous FIFO circuit of the present invention is also applicable under the conditions provided below.
(1) Write clock (high frequency)>read clock (low frequency)
(2) Write clock (low frequency)>read clock (high frequency)

In the configuration of (1) above, the data quantity of the write processing is larger than the data quantity of the read processing. Therefore, by setting a cycle in which write processing is not performed, it is possible to perform processing while preventing overflow of the write FIFO. Similarly, in the configuration of (2) above, the data quantity of the read processing is larger than the data quantity of the write processing. Therefore, by setting a cycle in which read processing is not performed, it is possible to perform processing while preventing reading of data not being written.

Second Exemplary Embodiment

Figure 6:
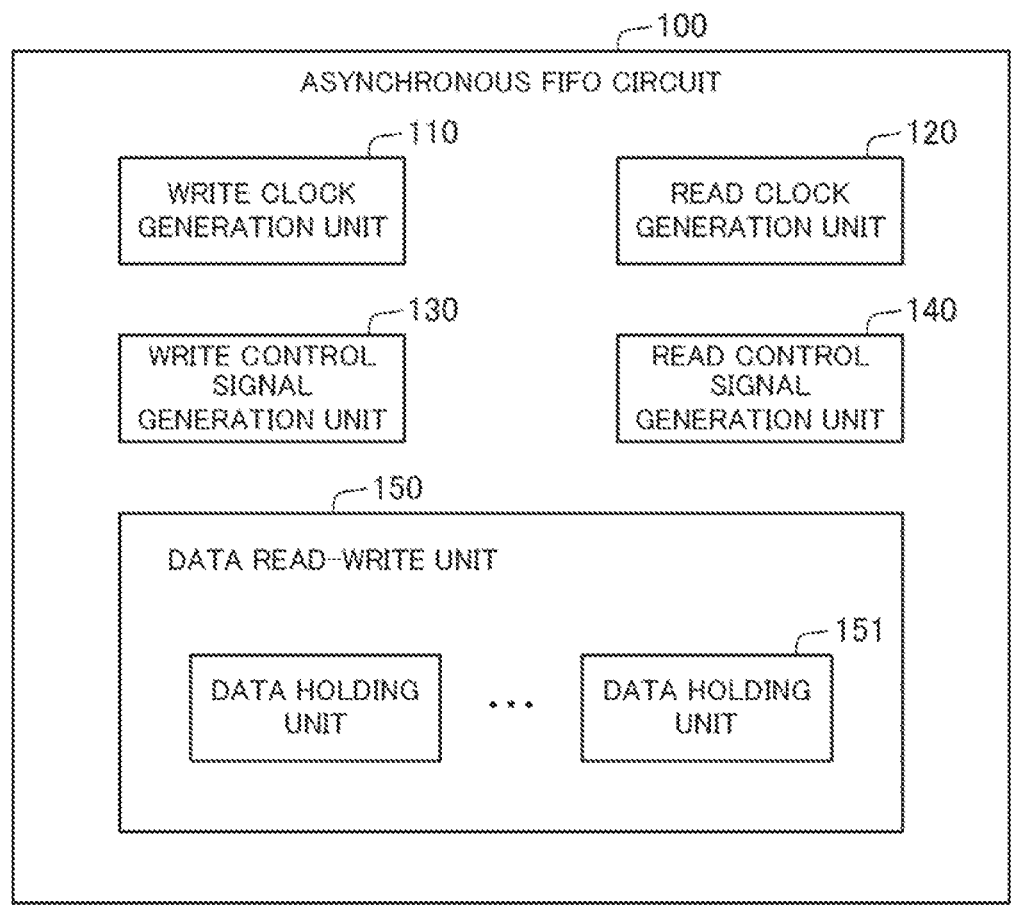
FIG. 6 is a block diagram illustrating a configuration of an asynchronous FIFO circuit according to a second exemplary embodiment of the present invention.

Next, a second exemplary embodiment of the present invention will be described with reference to FIG. 6. FIG. 6 is a block diagram illustrating a configuration of an asynchronous FIFO circuit according to the present embodiment. Note that the present embodiment shows the outline of the configuration of the asynchronous FIFO described in the first exemplary embodiment.

As illustrated in FIG. 6, an asynchronous FIFO circuit 100 of the present embodiment includes a write clock generation unit 110 that generates, from an input clock, a write clock to be used in write processing, a read clock generation unit 120 that generates, from the input clock, a read clock to be used in read processing, a write control signal generation unit 130 that generates a write control signal for controlling data write timing, in synchronization with the write clock, a read control signal generation unit 140 that generates a read control signal for controlling data read timing, in synchronization with the read clock, and a data read-write unit 150 having a plurality of data holding units 151. The data read-write unit 150 writes data into one of the data holding units for each write clock on the basis of the write control signal, and reads data from one of the data holding units for each read clock on the basis of the read control signal.

According to the invention described above, a write clock and a read clock are generated from the same clock, and in synchronization with them, a write control signal for controlling the write timing and a read control signal for controlling the read timing are generated. Therefore, since the write cycle and the read cycle are operated under a defined cycle, delivery of data from a write pointer to a read pointer and check are unnecessary. As a result, control is not complicated, and latency from writing to reading can be reduced.

<Supplementary Notes>

The whole or part of the exemplary embodiments disclosed above can be described as, but not limited to, the following supplementary notes. Hereinafter, outlines of the configurations of an asynchronous FIFO circuit and a data read-write method according to the present invention will be described. However, the present invention is not limited to the configurations described below.

(Supplementary Note 1)

An asynchronous FIFO circuit comprising:

a write clock generation unit that generates, from an input clock, a write clock to be used in write processing;

a read clock generation unit that generates, from the input clock, a read clock to be used in read processing;

a write control signal generation unit that generates a write control signal for controlling data write timing, in synchronization with the write clock;

a read control signal generation unit that generates a read control signal for controlling data read timing, in synchronization with the read clock; and a data read-write unit having a plurality of data holding units, wherein the data read-write unit writes data into one of the data holding units for each write clock on a basis of the write control signal, and reads data from one of the data holding units for each read clock on a basis of the read control signal.

(Supplementary Note 2)

The asynchronous FIFO circuit according to supplementary note 1, wherein the data read-write unit activates a series of write processing to be performed on a plurality of the data holding units on a basis of the write control signal, and activates a series of read processing to be performed on a plurality of the data holding units on a basis of the read control signal.

(Supplementary Note 3)

The asynchronous FIFO circuit according to supplementary note 2, wherein the data read-write unit activates the series of write processing and the series of read processing at same timing, on the basis of the write control signal and the read control signal.

(Supplementary Note 4)

The asynchronous FIFO circuit according to supplementary note 3, wherein the data read-write unit includes a write pointer generation unit and a read pointer generation unit, the write pointer generation unit generates a write pointer that specifies one of the data holding unit on which writing is performed for each write clock, and generates same write pointer each time the series of write processing is activated, and the read pointer generation unit generates a read pointer that specifies one of the data holding units from which reading is performed for each read clock, and generates same read pointer each time the series of reading process is activated, and the data read-write unit writes data into the one of the data holding units indicated by the write pointer generated for the each write clock, and reads data from the one of the data holding units indicated by the read pointer generated for the each read clock.

(Supplementary Note 5)

The asynchronous FIFO circuit according to supplementary note 4, wherein the write pointer generation unit and the read pointer generation unit generate the write pointer and the read pointer respectively such that the write pointer that is generated each time the series of write processing is activated and the read pointer that is generated each time the series of read processing is activated specify different ones of the data holding units respectively.

(Supplementary Note 6)

The asynchronous FIFO circuit according to any of supplementary notes 1 to 5, wherein a delay from a clock source of the input clock to the write clock generation unit and a delay from the clock source of the input clock to the read clock generation unit are set to be same.

(Supplementary Note 7)

An asynchronous FIFO circuit comprising:

a write domain phase locked loop (PLL) that generates, from an input clock, a write clock to be used in write processing;

a read domain PLL that generates, from the input clock, a read clock to be used in read processing;

a write control signal generation circuit that generates a write control signal for controlling data write timing, in synchronization with the write clock;

a read control signal generation circuit that generates a read control signal for controlling data read timing, in synchronization with the read clock; and a FIFO including a plurality of buffers, wherein the FIFO writes data into one of the buffers for each write clock on a basis of the write control signal, and reads data from one of the buffers for each read clock on a basis of the read control signal.

(Supplementary Note 7.1)

The asynchronous FIFO circuit according to supplementary note 7, wherein the FIFO activates a series of write processing to be performed on a plurality of the buffers on a basis of the write control signal, and activates a series of read processing to be performed on a plurality of the buffers on a basis of the read control signal.

(Supplementary Note 7.2)

The asynchronous FIFO circuit according to supplementary note 7.1, wherein the FIFO activates the series of write processing and the series of read processing at same timing, on the basis of the write control signal and the read control signal.

(Supplementary Note 7.3)

The asynchronous FIFO circuit according to supplementary note 7.2, wherein the FIFO includes a write pointer generation circuit and a read pointer generation circuit, the write pointer generation circuit generates a write pointer that specifies one of the buffers on which writing is performed for each write clock, and generates same write pointer each time the series of write processing is activated, and the read pointer generation circuit generates a read pointer that specifies one of the buffers from which reading is performed for each read clock, and generates same read pointer each time the series of reading process is activated, and the FIFO writes data into the one of the buffers indicated by the write pointer generated for the each write clock, and reads data from the one of the buffers indicated by the read pointer generated for the each read clock.

(Supplementary Note 7.4)

The asynchronous FIFO circuit according to supplementary note 7.3, wherein the write pointer generation circuit and the read pointer generation circuit generate the write pointer and the read pointer respectively such that the write pointer that is generated each time the series of write processing is activated and the read pointer that is generated each time the series of read processing is activated specify different ones of the buffers respectively.

(Supplementary Note 7.5)

The asynchronous FIFO circuit according to any of supplementary notes 7 to 7.4, wherein a delay from a clock source of the input clock to the write domain PLL and a delay from the clock source of the input clock to the read domain PLL are set to be same.

(Supplementary Note 8)

A data read-write method comprising:

by an asynchronous FIFO circuit including a plurality of data holding unites, generating, from an input clock, a write clock to be used in write processing, and generating, from the input clock, a read clock to be used in read processing;

generating a write control signal for controlling data write timing, in synchronization with the write clock, and generating a read control signal for controlling data read timing, in synchronization with the read clock; and writing data into one of the data holding units for each write clock on a basis of the write control signal, and reading data from one of the data holding units for each read clock on a basis of the read control signal.

(Supplementary Note 9)

The data read-write method according to supplementary note 8, further comprising activating a series of write processing to be performed on the plurality of the data holding unites on a basis of the write control signal, and activating a series of read processing to be performed on the plurality of the data holding unites on a basis of the read control signal.

(Supplementary Note 10)

The data read-write method according to supplementary note 9, further comprising activating the series of write processing and the series of read processing at same timing, on the basis of the write control signal and the read control signal.

(Supplementary Note 10.1)

The data read-write method according to supplementary note 10, further comprising:

generating a write pointer that specifies one of the data holding units on which writing is performed for each write clock, and generating same write pointer each time the series of write processing is activated, and generating a read pointer that specifies one of the data holding units from which reading is performed for each read clock, and generating same read pointer each time the series of reading process is activated; and writing data into the one of the data holding units indicated by the write pointer generated for the each write clock, and reading data from the one of the data holding units indicated by the read pointer generated for the each read clock.

(Supplementary Note 10.2)

The data read-write method according to supplementary note 10.1, further comprising generating the write pointer and the read pointer respectively such that the write pointer that is generated each time the series of write processing is activated and the read pointer that is generated each time the series of read processing is activated specify different ones of the data holding units respectively.

While the present invention has been described with reference to the exemplary embodiments described above, the present invention is not limited to the above-described embodiments. The form and details of the present invention can be changed within the scope of the present invention in various manners that can be understood by those skilled in the art.

The present invention is based upon and claims the benefit of priority from Japanese patent application No. 2017-202859, filed on Oct. 19, 2017, the disclosure of which is incorporated herein in its entirety by reference.

REFERENCE SIGNS LIST

11, 21 PLL
12, 22 definer generation circuit
13, 23 FF
3 FIFO
31 write pointer generation circuit
32 read pointer generation circuit 311-3110 buffer
321 selector
100 asynchronous FIFO circuit
110 write clock generation unit
120 read clock generation unit
130 write control signal generation unit
140 read control signal generation unit
150 data read-write unit
151 data holding unit

What is claimed is:

1. An asynchronous FIFO circuit comprising:
a write clock generation unit that generates, from an input clock, a write clock to be used in write processing;
a read clock generation unit that generates, from the input clock, a read clock to be used in read processing;
a write control signal generation unit that generates a write control signal for controlling data write timing, in synchronization with the write clock;
a read control signal generation unit that generates a read control signal for controlling data read timing, in synchronization with the read clock; and
a data read-write unit having a plurality of data holding units, wherein
the data read-write unit writes data into one of the data holding units for each write clock on a basis of the write control signal, and reads data from one of the data holding units for each read clock on a basis of the read control signal,
the data read-write unit activates a series of write processing to be performed on the plurality of data holding units on a basis of the write control signal and a series of read processing to be performed on the plurality of data holding units on a basis of the read control signal, at a same timing, and
the data read-write unit includes a write pointer generation unit and a read pointer generation unit, the write pointer generation unit generating a write pointer that specifies one of the data holding units on which writing is performed for each write clock and generating a same write pointer each time the series of write processing is activated, the read pointer generation unit generating a read pointer that specifies one of the data holding units from which reading is performed for each read clock and generating a same read pointer each time the series of read processing is activated, and writes data into the one of the data holding units indicated by the write pointer generated for the each write clock and reads data from the one of the data holding units indicated by the read pointer generated for the each read clock.

2. The asynchronous FIFO circuit according to claim 1, wherein
the write pointer generation unit and the read pointer generation unit generate the write pointer and the read pointer respectively such that the write pointer that is generated each time the series of write processing is activated and the read pointer that is generated each time the series of read processing is activated specify different ones of the data holding units respectively.

3. The asynchronous FIFO circuit according to claim 1, wherein
a delay from a clock source of the input clock to the write clock generation unit and a delay from the clock source of the input clock to the read clock generation unit are set to be same.

4. An asynchronous FIFO circuit comprising:
a write domain phase locked loop (PLL) that generates, from an input clock, a write clock to be used in write processing;
a read domain PLL that generates, from the input clock, a read clock to be used in read processing;
a write control signal generation circuit that generates a write control signal for controlling data write timing, in synchronization with the write clock;
a read control signal generation circuit that generates a read control signal for controlling data read timing, in synchronization with the read clock; and
a FIFO including a plurality of buffers, wherein
the FIFO writes data into one of the buffers for each write clock on a basis of the write control signal, and reads data from one of the buffers for each read clock on a basis of the read control signal,
the FIFO activates a series of write processing to be performed on the plurality of buffers on a basis of the write control signal and a series of read processing to be performed on the plurality of buffers on a basis of the read control signal, at a same timing, and
the FIFO includes a write pointer generation circuit and a read pointer generation circuit, the write pointer generation circuit generating a write pointer that specifies one of the buffers on which writing is performed for each write clock and generating a same write pointer each time the series of write processing is activated, the read pointer generation circuit generating a read pointer that specifies one of the buffers from which reading is performed for each read clock and generating a same read pointer each time the series of read processing is activated, and writes data into the one of the buffers indicated by the write pointer generated for the each write clock and reads data from the one of the buffers indicated by the read pointer generated for the each read clock.

5. The asynchronous FIFO circuit according to claim 4, wherein
the write pointer generation circuit and the read pointer generation circuit generate the write pointer and the read pointer respectively such that the write pointer that is generated each time the series of write processing is activated and the read pointer that is generated each time the series of read processing is activated specify different ones of the buffers respectively.

6. The asynchronous FIFO circuit according to claim 4, wherein
a delay from a clock source of the input clock to the write domain PLL and a delay from the clock source of the input clock to the read domain PLL are set to be same.

7. A data read-write method comprising:
by an asynchronous FIFO circuit including a plurality of data holding units,
generating, from an input clock, a write clock to be used in write processing, and generating, from the input clock, a read clock to be used in read processing;
generating a write control signal for controlling data write timing, in synchronization with the write clock, and generating a read control signal for controlling data read timing, in synchronization with the read clock;
writing data into one of the data holding units for each write clock on a basis of the write control signal, and reading data from one of the data holding units for each read clock on a basis of the read control signal;
activating a series of write processing to be performed on the plurality of data holding units on a basis of the write control signal and a series of read processing to be performed on the plurality of data holding units on a basis of the read control signal, at a same timing;

generating a write pointer that specifies one of the data holding units on which writing is performed for each write clock and generating a same write pointer each time the series of write processing is activated, generating a read pointer that specifies one of the data holding units from which reading is performed for each read clock and generating a same read pointer each time the series of read processing is activated; and writing data into the one of the data holding units indicated by the write pointer generated for the write clock and reading data from the one of the data holding units indicated by the read pointer generated for the read clock.

8. The data read-write method according to claim 7, further comprising generating the write pointer and the read pointer respectively such that the write pointer that is generated each time the series of write processing is activated and the read pointer that is generated each time the series of read processing is activated specify different ones of the data holding units respectively.

\* \* \* \* \*